United States Patent [19]
Linke et al.

[11] Patent Number: 5,960,188
[45] Date of Patent: Sep. 28, 1999

[54] METHOD FOR MODELING ELECTRICAL INTERCONNECTIONS IN A CYCLE BASED SIMULATOR

[75] Inventors: Scott Lee Linke, Flora; Everett Ray Lumpkin, Galveston; Kirk Alan Bailey, Westfield; Jill Gosma Hersberger, Kokomo, all of Ind.

[73] Assignee: Delco Electronics Corporation, Kokomo, India

[21] Appl. No.: 08/816,308

[22] Filed: Mar. 13, 1997

[51] Int. Cl.$^6$ ...................................................... G06F 9/455
[52] U.S. Cl. ................................ 395/500.35; 395/500.34; 395/500.36; 395/500.37; 395/500.38
[58] Field of Search ............................ 364/578; 395/500; 707/104

[56] References Cited

U.S. PATENT DOCUMENTS

| | | | |
|---|---|---|---|
| 5,053,980 | 10/1991 | Kanazawa | 364/578 |
| 5,068,812 | 11/1991 | Scheafer et al. | 364/578 |
| 5,313,618 | 5/1994 | Pawloski | 395/500 |
| 5,335,191 | 8/1994 | Kundert et al. | 364/578 |
| 5,384,720 | 1/1995 | Ku et al. | 364/578 |
| 5,388,060 | 2/1995 | Adams, Jr. et al. | 364/579 |
| 5,426,768 | 6/1995 | Kanazawa | 395/500 |
| 5,440,697 | 8/1995 | Boegel et al. | 395/500 |
| 5,455,928 | 10/1995 | Herlitz | 395/500 |
| 5,467,462 | 11/1995 | Fujii | 364/578 |
| 5,487,595 | 1/1996 | Wise et al. | 303/168 |
| 5,493,672 | 2/1996 | Lau et al. | 395/500 |
| 5,678,028 | 10/1997 | Bershteyn et al. | 395/500 |
| 5,678,030 | 10/1997 | Sferrazza et al. | 395/500 |

OTHER PUBLICATIONS

Simulation Technology Definitions: SpeedSim Technology Definitions, obtained from World Wide Wed at http://www.speedsim.com/tech/ssdefs.htm.

"The SpeedSim/3Software Simulator, Reducing the Time and Cost of Design Verification" SpeedSim, Inc. Product Brochure obtained from http://204.178.65.251/products/brochure.htm.

Tuck, "Fast HDL–based cycle simulators rescue submicron designers," Computer Design, http://www.computer-design.com/Editorial/1995/09/Directions/fast.html, Sep. 1995.

Tuck, "After hard knocks, cycle–based simulators stand their ground," Computer Design, http://www.computer-design.com/Editorial/1996/10/ASIC/after.html, Oct. 1996.

*Primary Examiner*—Kevin J. Teska
*Assistant Examiner*—Samuel Broda
*Attorney, Agent, or Firm*—Jimmy L. Funke

[57] ABSTRACT

The present invention relates to a method and apparatus for verifying the correct performance of software on an electrical system by use of a cycle-based simulator. More specifically, it relates to an apparatus and method for simulating an electrical interconnection between two electronic subsystems, or modules, within a cycle based simulator. Two separate devices, a hardware output's driver and a hardware input's receiver, are characterized as one type of simulated object, a node, and the interconnection between the two devices as a second type of simulated object, a wire. The activity of output nodes is limited to placing signal values on the wire. Input nodes have a characteristic behavior in response to the information from output nodes. The wire is enhanced by storage and comparison functions that allow the comparison between new and current values of output signals as well as identification of the cycle associated with a particular change.

14 Claims, 10 Drawing Sheets

METHOD FOR MODELING ELECTRICAL INTERCONNECTIONS IN A CYCLE BASED SIMULATOR

FIELD OF THE INVENTION

This invention relates to the design of cycle-based simulators for electronic systems. The contemplated electronic systems include those made with two or more independent electronic subsystems or circuits, such as a microcontroller and its peripheral devices. The simulators can provide fast, cycle accurate software verification by simulation, and are easily re-configured. They are particularly useful for testing software designed for use on consumer goods that contain electronic systems, such as automotive vehicle control systems.

BACKGROUND

It is known to use various types of electronic systems in all manner of consumer goods. Such systems typically include some means of receiving instructions from the consumer, a controller such as a microprocessor on a silicon chip, and peripheral devices such as sensors and output generators. A microwave oven, for example, may be instructed by a consumer who pushes a series of buttons to tell it to generate microwaves at a given power level for a given period of time. A more complex oven may include a sensor that will automatically cut off operation once a given temperature is reached. A far more complex example would be anti-lock brake and traction control systems such as the ones described in U.S. Pat. No. 5,487,595 issued to Wise, et al., Jan. 30, 1996.

Each of the above-described systems is dependent upon software, which is a pattern of instructions that operates on the microprocessor and its peripheral devices. The nature of the software, in turn, is influenced by the final design of the microprocessor and peripheral devices. In a normal product development cycle, both the peripheral devices and the software are likely to be changed, and the microprocessor may also change. Further, once a product design has been finalized, the product must be tested in a wide variety of circumstances to assure a manufacturer that the product will function as expected. Consequently, product development cycles of 3–5 years are not uncommon. An advantage of the present invention is that the time frame for a product development cycle may be reduced by increasing the efficiency of software testing. The inventors have devised a faster means of verifying whether software will operate on an electronic system in the expected manner, by simulation.

Various forms of circuit simulators are known. As used herein, the term circuit simulator means a software-driven system used to predict the behavior of electrical circuits or other physical systems. Given a description of a circuit and a stimulus, the simulator produces the response, or output, of the circuit to the stimulus.

Generally, the user describes the circuit to the simulator by giving a list of components and a specification indicating how they are interconnected. Each component is described in terms of its elements such as transistors, capacitors and resistors. The simulator has a mathematical model of each element of each component, and given a list of components, it is able to formulate a system of equations. The simulator then solves the system of equations and presents the solution to the user as the response of the circuit. The process of solving the system of equations is often a multipass process where the output of one element becomes the input to another element. In that case, multiple simulation passes must be performed in order to obtain the response of the circuit to the original stimulus. Where large numbers of circuit elements are involved, the number of calculations and their interrelationships becomes very large, very quickly. Also, the purpose of the simulator is to "put the system through its paces", that is, test the system in as many different situations as its creators can imagine a consumer might encounter. As a result, the process of performing a simulation can become unwieldy, and very time-consuming.

This detailed simulation of a circuit, or circuit-level simulation, is done when the operation or behavior of the circuit is first being developed and designed. Large circuits can contain millions of elements. Simulation of the circuit is necessary in order to analyze the interaction of all of the elements because it is impractical to physically build a new circuit every time a change is being considered. However, the speed of the simulation is slow due to the large number of calculations involved.

Several strategies for increasing the speed of simulation are known. Obviously, upgrading the calculating speed and capacity of the microcomputer workstation executing the simulator would be helpful, but such increases are bought at the price of new, expensive equipment. It is not economically feasible to attempt to match the calculating speed and capacity needs of new simulated hardware designs by continuously upgrading the physical equipment executing the simulator. Other strategies must be developed. In general, these strategies rely on various means of reducing the number of calculations involved.

For example, U.S. Pat. No. 5,068,812, issued to Schaefer, et al. Nov. 26, 1991, relates to a method of reducing the number of calculations required for simulation of a logic circuit by marking those elements which require new evaluation due to a change in the value of their input signals. Elements which have not been marked will be skipped. The change in value of an input signal is referred to as an "event", and simulators that operate primarily using this principle are referred to as "event-based or event-driven simulators". In principle, for each new event, a new simulation pass must be performed.

U.S. Pat. No. 5,467,462 issued to Fuji Nov. 14, 1995 relates to an event-driven simulator that further allows an operator to pre-set the definition of an event and also identify the follow-up calculation.

U.S. Pat. No. 5,426,768 issued to Kanazawa points out that event-driven simulators are subject to deadlocks when different portions of the circuit would give conflicting instructions to a single sub-element. A hierarchy based on the time the event occurred is established, and calculations with a lower selection priority are delayed, thereby providing an orderly way of organizing multiple simulation passes.

U.S. Pat. No. 5,384,720 issued to Ku et al. Jan. 24, 1995 relates to a simplified method of identifying which events are important, that is, which changes in input value affect either the internal stored state of the circuit or the outputs of the circuit. A user specifies which outputs are important via a "watched nodes list" and then the simulator monitors those nodes over time, and identifies those nodes which have varying signal values during a defined time period. Then new simulation passes are performed on the logic circuit for events on those identified nodes.

U.S. Pat. No. 5,335,191 issued to Kundert et al. Aug. 2, 1994 relates to a circuit simulator having improved efficiency due to a rearrangement of the location where calculations take place. A simulation engine processor provides specific instructions to component processors as to exactly which type of calculation among several possibilities is desired. Lists of information as to the past or current value of calculations of interest within the component processors are maintained within the engine processor so that the assessment of whether an event of interest has occurred is made by the engine processor instead of the component processors. As a result, the complexity and expense of the component processors are reduced.

In general, it is known that simulation speed can be increased by grouping a set of elements together and modeling the aggregate behavior of the elements. Then the behavior of the group is simulated as a single object. Such groupings may include only two elements or thousands of elements. Once a grouping is made, the individual behavior of each element is subsumed into the overall behavior of the group. Significant simulation speed performance improvements can be achieved if the groupings can collect large numbers of elements. For example, U.S. Pat. No. 5,053,980, issued to Kanazawa Oct. 1, 1991 relates to an event-based simulator in which grouped events are labelled with an identifier (color), thereby allowing a limited amount of parallel processing.

The references described above all relate to event-driven simulators which operate at the hardware, or gate, level. They are typically used to analyze and verify the correct operation of an electrical circuit at various levels of detail. Typical users of such simulators are those who design, test and build the circuit.

Other types of circuit simulators are known, such as statically scheduled simulators. U.S. Pat. No. 5,455,928 issued to Herlitz Oct. 3, 1995 relates to a method of using a computer-aided design tool called a bus resolution block to represent groups of similar data paths in a logic circuit diagram. The bus resolution block is a program function that represents a table of possible input combinations and user-defined output responses. It allows an operator to bundle several data paths, and to resolve conflicts that occur where several drivers would attempt to act on the same input receiver. To achieve the desired end, the programmer first represents bi- or multi-directional data flow as multiple output drivers and input receivers, each with unidirectional data flow. Then the bus resolution blocks are inserted. This allows the programmer to design a statically scheduled simulation, that is, a simulation in which all data flow is represented as flowing in a single direction from outputs to inputs through each possible decision point in any given connection so that the data path is fixed at all times, that will accurately represent a circuit which employs multiple drivers or bidirectional data flow.

In the present case, the present inventors were not interested in verifying the correct assembly and interaction of all of the elements of a circuit, for example, to test the design of a new microprocessor chip. Rather, they were interested in questions that may arise when one is using the microprocessor as a control circuit in a larger system. In such a case, one ought to be able to presume that the original circuit functions correctly and explore the circuit's interaction with other circuits. Additionally, if the circuit is programmable, the user may be interested in the response of the overall system to various programming combinations. In that case, the question is not whether the microprocessor operates properly, but whether the pattern of instructions entered by the system designer are correct and complete: effort spent on verifying the underlying design of the microprocessor would not be directed to the inquiry of interest. For example, in a computer system where the central processing unit (CPU) is one circuit and memory is another, the present inventors would be interested in populating the memory with instruction patterns for the CPU to operate on. Any action by the simulator to test the operation of transistors or groups of transistors within either the memory's circuit or the CPU's circuit would only waste time or provide misleading results.

Another factor to be considered with respect to event-driven simulators is their treatment of time. Since events in an event-driven simulator are asynchronous, that is, not bound to a fixed time, any number of events can occur simultaneously. Therefore, the passage of time itself must be treated as an event which must be monitored, and the size of the time increment will determine the resolution and accuracy of the event-driven simulation. Consequently, the simulation of one system level clock cycle for a simple microcomputer system (CPU and memory) may require the simulation of thousands of events. Furthermore, the addition of a peripheral, such as a serial communication channel, will add even more events per clock cycle, potentially halving the simulator's overall performance.

In contrast to event-based simulators, a cycle-based simulator builds on the characteristic of large electrical systems that they are usually synchronous in nature. That is, the activity of several circuits is co-ordinated: their activity is commonly initiated and terminated by a clocking signal which can be set for a given period of time in seconds. The electrical system, therefore, is regulated by a clock signal, and all behavior within the system occurs within a given, regular period of time which can be referred to as clock signal transitions or cycles. A simulator might take advantage of this feature and optimize its performance by compressing the execution of multiple simulation passes for an element or group of elements into a single simulation pass with respect to a clock signal transition. This approach is viable because any output signals that change while the clock signal is static would not necessarily require resimulation of all affected inputs if the inputs are also regulated by the clock signal. The hazard of this approach is that some simulation accuracy may be lost if there is no method to deal with important information which may have changed while the clock signal was static. An example of such information would be the speed of a wheel or the pressure on a brake pedal. Therefore, for real-world testing, some method must be found to accommodate information which may not change according to a clocking signal, that is, asynchronous information. The simulator of the present invention may be regarded as a hybrid cycle-based simulator with asynchronous information support capability.

A simulator that takes advantage of the regulatory behavior of a clock signal is known as a cycle-based simulator. While such simulators present interesting possibilities, the known commercially available cycle-based simulators are still too slow for satisfactory performance in large electronic systems. See for example the SpeedSim, Inc. Product Brochure, "SpeedSim/3 Software Simulator" available at http://www.speedsim.com, which as of Oct. 20, 1996 offered verification speeds of 10 to 1000 cycles per second. This product, like the event-based references discussed above, is directed to the design of electrical circuits such as microprocessor chips, not verification of software on electronic systems for real-world applications.

Another recently introduced industry example is the "Seamless Co-Verification Environment (CVE) by Microtec, Mentor Graphics Corp., available at http://www.mentorg.com. This product is believed to combine an Instruction Set Simulator (memory and CPU) with a standard event based simulator (Verilog/VHDL). This product essentially replaces some well understood hardware behaviors, such as accessing memory, with custom code that assumes the hardware is already verified. Per a May 20, 1996 Electronic Engineering Times article (currently available at www.techweb.com/se/directlink.cgi?EET19960520S0022), the product has a performance of about 3,000 instructions per second. The higher rates of simulation are achieved at the expense of shutting off additional circuit blocks such as clocking signals, simulation blocks, and sacrificing some accuracy for speed.

In order to be of practical value, a cycle-based simulator for an electronic system should run at least about 10,000 cycles per second, preferably at least about 50,000 cycles per second, and more preferably at least about 100,000 cycles per second. Further, it must provide some mechanism to ensure that accuracy of simulation is not lost due to truncation of simulation activity by the clocking signal, and must accommodate asynchronous information, that is, information that must be updated continuously because it does not conform to a clocking signal.

SUMMARY OF THE INVENTION

The object of this invention is to provide a simulator for testing software on electronic systems. Another object of this invention is to provide a simulator having greatly increased speed of performance. Yet another object of this invention is to provide a simulator that can be used to test software on an altered control circuit. An advantage of this invention is that the product development cycle time may be reduced where extensive testing of an electronic system must take place late in the product development cycle.

A further object of this invention is to provide a method and apparatus for interconnecting blocks of electrical circuitry, or modules, that are being simulated in a cycle-based simulator. Such interconnections are not limited to the transfer of electrical information such as voltage and current but may also provide state or status information as desired. Yet another object of this invention is to provide a means for simulation of multiple modules wherein the simulation of each module is independent of the order of simulation.

It is a further objective to provide a method to communicate information and any associated behavior across the interconnection in such a manner that the need for the modules to be simulated more than once per cycle is minimized. Further objects and advantages of this invention will become apparent through the disclosure herein.

The objects and advantages of the present invention can be obtained by use of software that characterizes the electrical interconnection between two electronic circuits, or modules, within a cycle-based simulator as interconnected objects which are conveniently named nodes and wires. A node is the means by which a module can assert information to (by way of an output node) or acquire information from (by way of an input node) a wire. Multiple nodes can be attached to one wire. A wire connects two or more nodes and is the means for accepting, synchronizing and storing information from output nodes. A wire is also the means by which input nodes access stored information or have the information delivered, especially information relating to a defined behavior. At least two nodes and one wire are required to define an interconnection. Modules will typically have many input and output nodes. Further, several nodes of both types may refer to the same physical structure within the module.

According to the present invention, an output node will be able to assert new information in either an arbitrated or restricted mode. The arbitrated mode allows for multiple output nodes to be connected to a wire. The restricted mode guarantees that only one output node is connected to the wire.

The present invention also provides a means for a module to poll, or check, an input node and acquire the synchronized or unsynchronized present value of the information within a wire. The invention further provides a means to directly notify a module when the synchronized or unsynchronized information changes within the wire.

The present invention also provides a method where the synchronized value of a wire is known as the current value and the unsynchronized value is known as the new value. A new value becomes the current value in a cycle following the one in which it was made new. The transfer is optimized to occur on demand due to polling by an input node or a need for an output node to assert another new value.

Although the present invention is described primarily in terms of software simulators, it can be used generally as a means of communication between blocks of software logic, and is especially useful for synchronizing behavior between such blocks. The present invention could be used, for example, in an operating system to enable the exchange of messages in a reliable and predictable way between different pieces of programming. In that event, a Wire might be more properly referred to as a communications channel, the Node would then be a port, and the information exchanged is more likely to be state information rather than voltage.

These and other objects and advantages of the present invention will be apparent to those of ordinary skill in the art in light of the following detailed description of the preferred embodiment.

BRIEF DESCRIPTION OF THE DRAWINGS

FIG. 5 shows a method for updating an Output Node's data structure.

FIG. 6 is a flow chart for a voting or arbitration method, that is, a method for deciding which among several output nodes will be allowed to determine the new values of a Wire.

FIG. 7 is a flow chart for the process of updating a Wire's data structure as a result of the arbitration that occurred in FIG. 6.

DETAILED DESCRIPTION OF THE INVENTION

Figure 1:
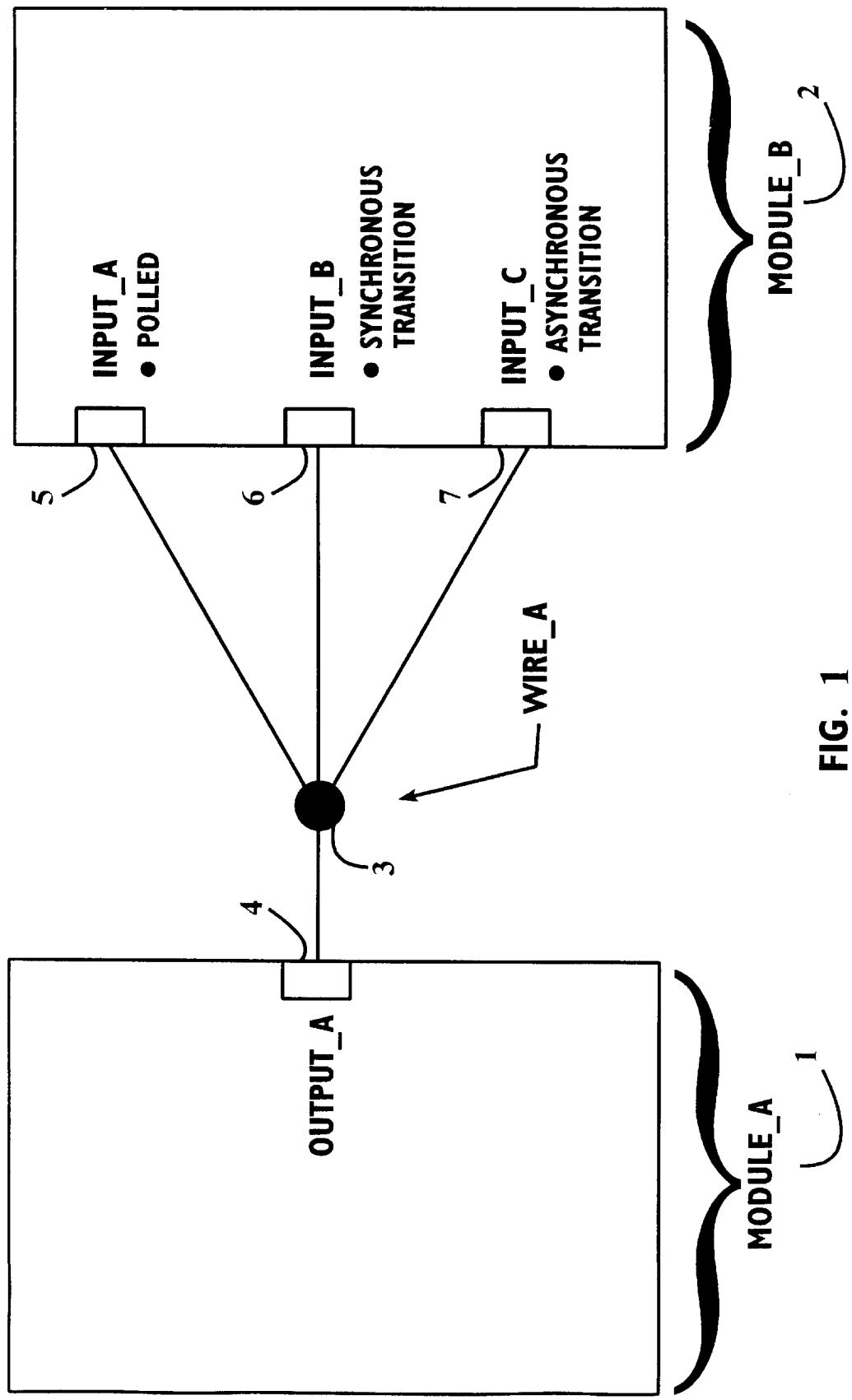
FIG. 1 illustrates a block diagram of an output node connected to three inputs by one wire with each input possessing a unique, different input behavior.

The preferred embodiment of the present invention provides a method and apparatus for testing software on an electronic system using a cycle-based simulator. Such a simulator is capable of providing a model of a microcomputer embedded in a consumer product that accurately reflects the actions taken by the components of the microcomputer in a given clock cycle.

A convenient description of the interconnection of modules such as a Central Processing Units (CPU), Memory Decoder and a Serial Channel is made possible by the present invention. Each module contains nodes that allow the transfer of information to and from a wire. The module controls when and what information is placed in the data structure of the output node; the node is strictly a means for transferring the information.

Table I lists the type of data which may be associated with a node. This data structure is generally applicable to all nodes, including input nodes, output nodes, and input/output nodes.

TABLE I

Data Structure for Nodes

| Output Node | Input Node | Input/Output Node |
|---|---|---|
| Node Name | Node Name | Node Name |
| Wire Name | Wire Name | Wire Name |
| Output Level | — | Output Level |
| Output Strength | — | Output Strength |
| — | Synchronous Transition Function | Synchronous Transition Function |
| — | Asynchronous Transition Function | Asynchronous Transition Function |

The Node Name uniquely identifies a node within the cycle-based simulator. The Wire Name uniquely identifies a wire that is connected to the node.

The Output Level and Output Strength each contain different classes of information that a given output node would like to assert on the wire identified by the Wire Name when the wire is read, or synchronized. In the present embodiments of the invention, "strength" is a designation of priority, while "level" is a value that can represent voltage and state (that is, status). In general, state or status refers to a wide variety of coded information types which are dependent on a specific application. For example, a status could represent a count, or one of several preselected codes. It can be used to abstract, for instance, information about several wires, which can then be treated as one Wire. The combination of the level and the strength can be used to characterize a wire, that is, describe its value. The value of a Wire connected to multiple outputs can be derived by comparing the strength of all the outputs, where the strongest (highest priority) output wins. That is, the Wire's value as ultimately read by an Input Node will be the strength and level of the strongest (highest priority) Output Node. In the event of a tie between two or more output nodes of the same strength, additional testing is done in order to examine the respective levels. If the level of the nodes in question is the same, the Wire will acquire that common level. If the values for level are different, the wire will acquire a special "undefined" Level.

The Synchronous Transition Function identifies an operation the module will perform whenever the named wire's synchronized value, that is, its Current Level or Current Strength, changes and is available to a given input node. The Asynchronous Transition Function identifies an operation the module will perform whenever the named wire's unsynchronized value, that is, its New Level or New Strength, changes and is available to a given input node. A given input node need not be associated with any transition function. In that case, the node possesses polled behavior and may be referred to simply as a "non-transition input node". A given node may function as an output node, an input node, or an input/output node, depending on the circumstances.

A particular Output Node is identified by its Node Name and can only place a value on a wire by means of its Output Level or Output Strength. The affected wire is identified by the Wire Name. Output Nodes do not have Transition Functions. As a consequence, the only data needed to populate an Output Node's data structure would be the Node Name, Wire Name, Output Level and Output Strength. The module associated with the Output Node controls what information is placed in the Output Node's data structure and when the data is placed. That is, the behavior controlling the placement of values on a Wire is said to be in the domain (or, block of programming) of the module encapsulating the Output Node.

Input Nodes are also identified by the Node Name and can only access information on the wire identified by the Wire Name. Input Nodes do not have Output Levels or Output Strengths. In contrast to output nodes, input nodes are viewed as having a characteristic behavior in response to information from a wire, behavior which is dependent upon the nature of the node as much as the nature of the information or the associated, or encapsulating, module. This behavior can be collected in an independent domain (or block of programming) and associated with a Transition Function for a particular Wire, which may be Synchronous or Asynchronous. When this is possible, the encapsulating module need never directly reference the Input Node, since the behavior associated with the node is described in a Synchronous or Asynchronous Transition Function, thereby moving its behavior outside the domain of the encapsulating module. For example, it may be found that the response of a module to certain values assertable by a given Wire is very predictable. This response can be abstracted so that the effect is tied more directly to the cause. Instead of continually checking the actual value of a wire (which may occur one or more times per module in many modules during a single cycle) the module is free to check the value of a Wire only when the value changes. The gain in efficiency can be significant because the simulation rate may be doubled or tripled.

Thus, the data structure of an input node need only contain a Node Name, Wire Name, and may include a Synchronous Transition Function, or Asynchronous Transition Function. As stated above, a given input node need not be associated with any transition function, in which case the node would be a "non-transition input node".

As can be deduced, an Input/Output Node is the union of an Output Node and Input Node. It can both access and place values on a Wire as well as have Transition Functions.

The inventors have found it convenient in the present embodiment to use the data structure of Input/Output nodes for all nodes. As a consequence, the actual distinction between node types becomes one of how the data structure is populated. In order to enforce a distinction, separate input and output methods restrict access to data elements accordingly. A further useful restriction is that the methods described herein will only be applied to a given node when the Node's Name is on the Wire's applicable List of Output Nodes or List of Input Nodes.

Table II lists the data associated with a wire.

TABLE II

Data Structure for a Wire

Wire Name
Current Level
Current Strength
New Level
New Strength
Arbitrated Level
Arbitrated Strength
Change Marker
List of Output Nodes
List of Input Nodes
List of Synchronous Transition
Input Nodes
List of Asynchronous Transition
Input Nodes
Asynchronous Level
Asynchronous Strength
Asynchronous Oscillation Count Again, the Wire Name uniquely identifies the wire within the cycle-based simulator. The Current Level and Current Strength contain information that has been previously asserted by some node and has been synchronized. The New Level and New Strength contain information that is being asserted by some node and has not been synchronized. The Arbitrated Level and Arbitrated Strength are used to contain dynamic information generated during the process of arbitrating the Strengths, or priorities, of Output Nodes that are connected to the Wire. Those skilled in the art will recognize that the Arbitrated Level and Arbitrated Strength can be temporary variables. The Change Marker will be zero if the value of the wire is up to date. Otherwise, the Change Marker will hold a value that uniquely identifies the cycle in which the wire's value was changed or is being changed. The List of Output Nodes contains the Node Names of all nodes that are allowed to assert their Output Level and Output Strength to the Wire. The List of Input Nodes contains the Node Names of all nodes that are allowed to poll the Current Level, Current Strength, New Level, or New Strength information. The List of Synchronous Transition Input Nodes contains the Node Names of all nodes that have Synchronous Transition Functions that should be performed whenever the information in Current Level or Current Strength changes. The List of Asynchronous Transition Input Nodes contains the Node Names of all nodes that have Asynchronous Transition Functions that should be performed whenever the information in New Level or New Strength changes. The Asynchronous Level and Asynchronous Strength contain a copy of the information held in New Level and New Strength and statically hold the information for the Asynchronous Transition Functions in the List of Asynchronous Transition Input Nodes. The information in New Level and New Strength cannot be presumed constant because some combination of behaviors in the Asynchronous Transition Functions may cause the wire's value to change again. The Asynchronous Oscillation Count contains a count of the number of times a wire's value has changed due to an Asynchronous Transition Function. The count is maintained so that a limit may be placed on the number of times a wire's value may oscillate, thereby preventing an infinite series of changes.

Those of ordinary skill in the art will recognize that the term "wire" refers to a mere conduit for an electrical signal such as a piece of copper. For simulation purposes, a wire is commonly used as a convenient name for a repository of a signal's value. In the present invention, the data structure for a wire is enhanced by storage and comparison functions that allow the comparison between new and current values of output signals, the identification of which cycle is associated with a particular change, and also a list of behavior functions associated with a change in value.

Referring now to FIG. 1, Module A (1) is connected to Module B (2) via a single Wire A(3). For illustrative purposes, the different possible responses an input receiver might have with respect to the same output information have been drawn as separate interconnections. Output node A(4) in Module A(1) can assert information onto the wire which is connected to Input node A(5), Input node B(6), and Input node C(7) in Module B(2). The three separate lines to each input node are illustrative only and do not imply three wires.

Input node A(5) illustrates polled behavior with respect to the information in the Wire A(3). That is, Input node A(5) has neither Synchronous or Asynchronous Transition Functions associated with it, and the simulation logic for Module B(2) will periodically poll the wire for its Current Level and Current Strength information.

The Input node B(6) illustrates Synchronous Transition behavior. That is, Input node B(6) will have only a Synchronous Transition Function, and the Wire A(3) will perform the function whenever Wire A(3)'s Current Level or Current Strength values change.

The Input node C(7) illustrates Asynchronous Transition behavior. That is, it will have only a Asynchronous Transition Function and the Wire A(3) will perform the function whenever Wire A(3)'s New Level or New Strength values change.

Figure 2:
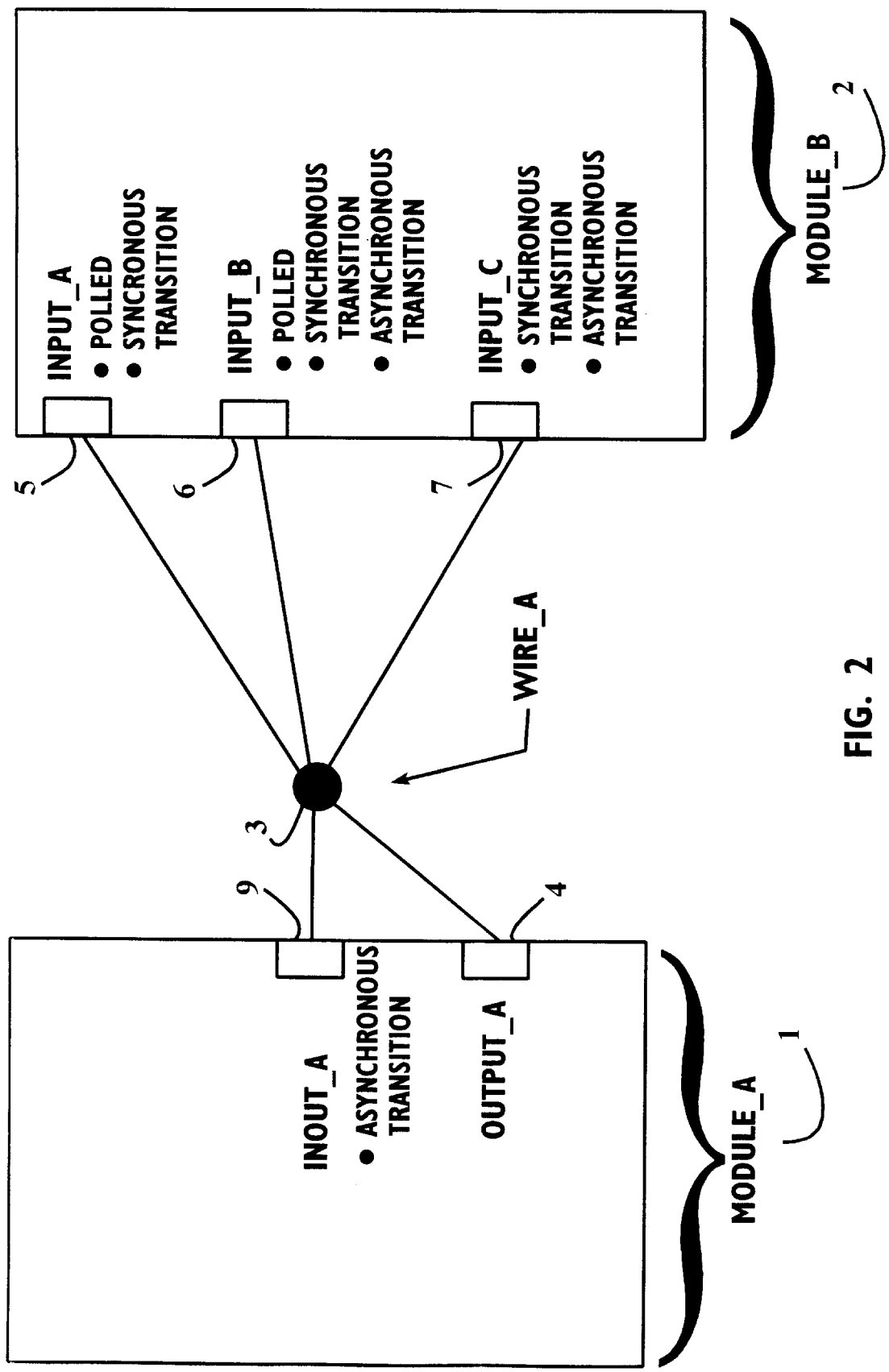
FIG. 2 illustrates a block diagram of an output node, three input nodes and an input/output node that are interconnected by one wire with each input possessing a combination of different input behavior.
Figure 3A:
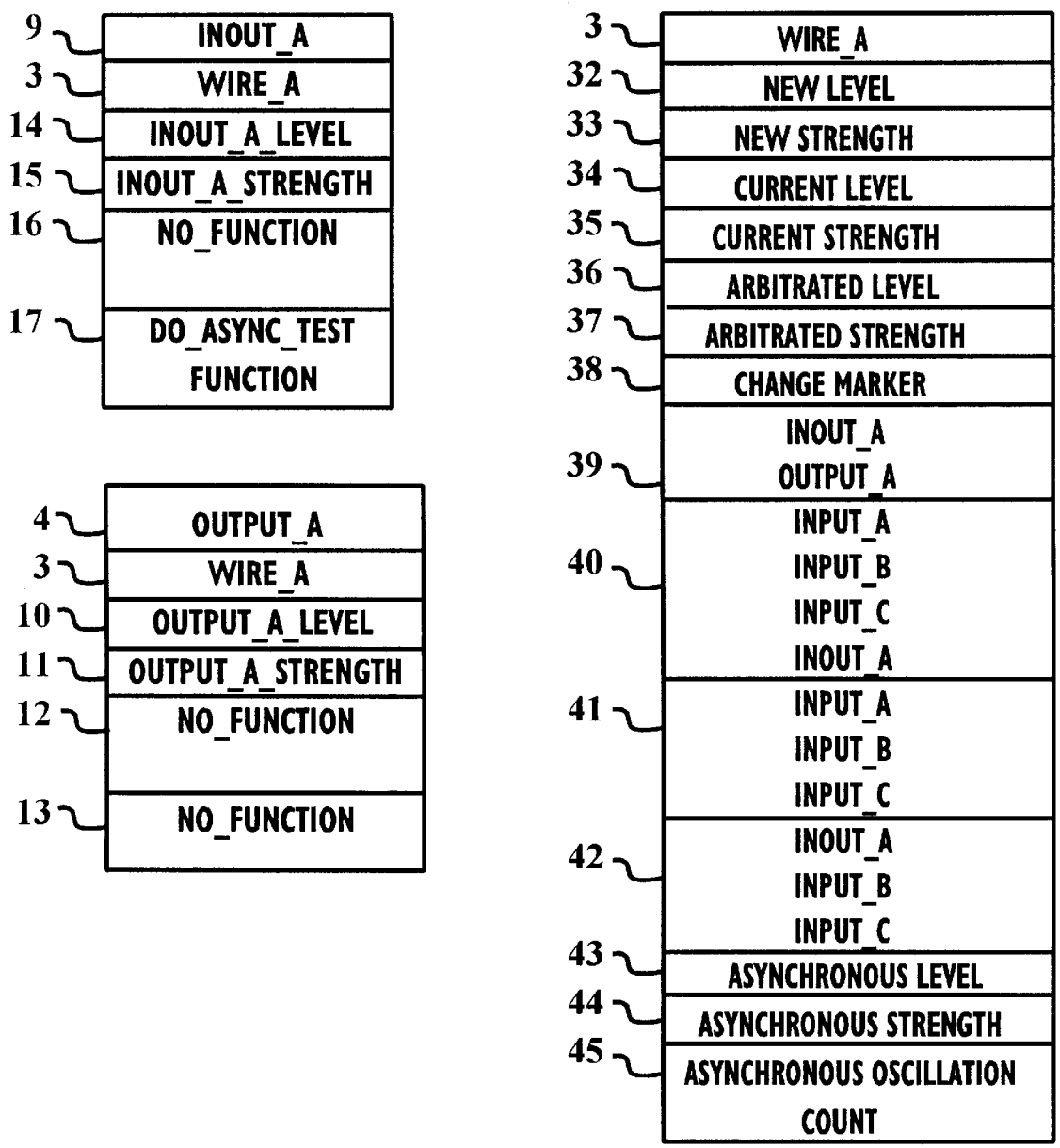
FIG. 3(A,B) illustrates the resulting configurations of information storage means for the block diagram of FIG. 2.
Figure 3B:
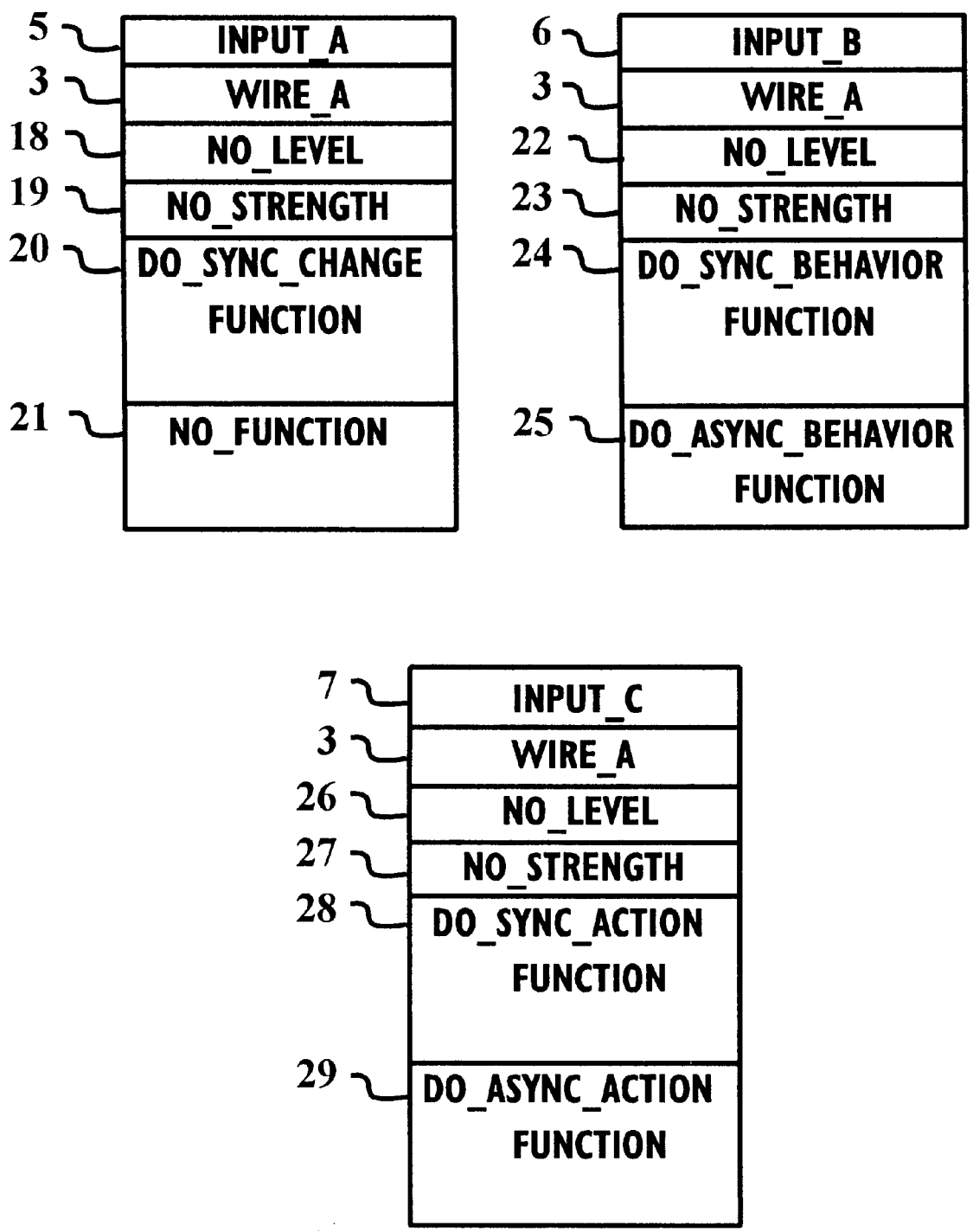

The diagram in FIG. 2 is an extension of FIG. 1 in that it demonstrates the potential for an Input Node to possess multiple behaviors with respect to the same wire. In FIG. 2, an Input/Output Node A(9) is added and possesses both an input node portion and an output node portion merged together. Input Node A(5) now has both Polled and Synchronous Transition behavior. Input Node B(6) has Polled, Synchronous Transition and Asynchronous Transition behavior. Input Node C(7) has, Synchronous Transition and Asynchronous Transition behavior. A second output Node, Input/Output Node A(9), is included to demonstrate that multiple output nodes can be attached to the same wire. In addition, the input node portion of Input/Output Node A(9) has Asynchronous Transition behavior. FIG. 3(A,B) summarizes the completed data structures for the nodes and wire of FIG. 2. For the sake of convenience, the nodes are depicted with the data structures for an Input/Output Node with the notations no_level, no_strength and no_function populating unused fields.

Output Node A(4) is identified with Wire A(3) and has certain Output Level(10) and Output Strength(11) information. It has no Synchronous Transition Function(12) and no Asynchronous Transition Function (13).

Input/Output Node A(9) is associated with Wire A(3) and has certain Output Level (14) and Output Strength(15) information. This Node has no Synchronous Transition Function(16), and its Asynchronous Transition behavior(17) is to do a given Asynchronous Test Function.

Input Node A(5) is associated with Wire A(3). Since this is an input node, its Level (18) and Strength(19) entries are not populated. This Node is shown to have a Synchronous Transition behavior (20) identified as "Do Synchronous Change Function". It has no Asynchronous Transition (21) behavior.

Input Node B(6), like Input Node A(5) is associated with Wire A(3), has entries "no level" (22) and "no strength"(23). It has Synchronous Transition (24) behavior identified as "Do Synchronous Behavior Function" and Asynchronous Transition (25) behavior identified as "Do Asynchronous Behavior Function".

Input Node C(7) is associated with Wire A(3), and has "no level"(26) and "no strength"(27) entries. It has Synchronous Transition(28) behavior identified as "Do Synchronous Action Function" and Asynchronous Transition(29) behavior identified as "Do Asynchronous Action Function".

Wire A(3) maintains information as to Current Level(34) and Current Strength(35) as well as New Level(32), New Strength(33), Arbitrated Level(36), Arbitrated Strength(37) and a Change Marker(38). It has a List of Output Nodes(39) which includes Output Node A(4) and Input/Output Node A(9), a List of Input Nodes(40) which includes Input Nodes A(5), B(6) and C(7), and Input/Output Node A(9), a List of Synchronous Transition Input Nodes(41) which includes Input Nodes A(S), B(6) and C(7), a List of Asynchronous Transition Nodes(42) which includes Input Nodes B(6), C(7) and Input/Output Node A(9), Asynchronous Level(43), Asynchronous Strength(44), and Asynchronous Oscillation Count(45).

The presently invented organization of data structure and the use of Transition Functions provides the user with a distinct advantage by associating behavior to inputs and outputs independent of the main behavior of the encapsulating module. Certain behavior within a module is coupled to an input or output and is independent from other modules. Such behavior is extractable and can be characterized mathematically, thereafter becoming the basis for a Synchronous or Asynchronous Transition Function.

A Transition Function is a set of behavior directly associated with a change, or transition, of a wire's value. An example would be the strobing signal for a serial communication interface. When the strobe signal transitions from a logic low to a logic high, information is transferred from a buffer to a register. A transition from a logic high to a logic low is not significant. Typical simulation techniques would require the module simulation to repeatedly check the strobe signal and explicitly test for a low-high transition, and then perform the information transfer. The behavior of distinguishing a low-high (versus high-low) transition and the transfer of information from buffer to register is behavior that is tightly coupled to the strobe signal. Hence, it can be extracted, or mathematically described, as a Transition Function and associated with the strobe signal's wire. Then the test will only be performed when the value of the wire changes instead of every simulated clock cycle. This leads to a significant performance improvement.

Figure 4:
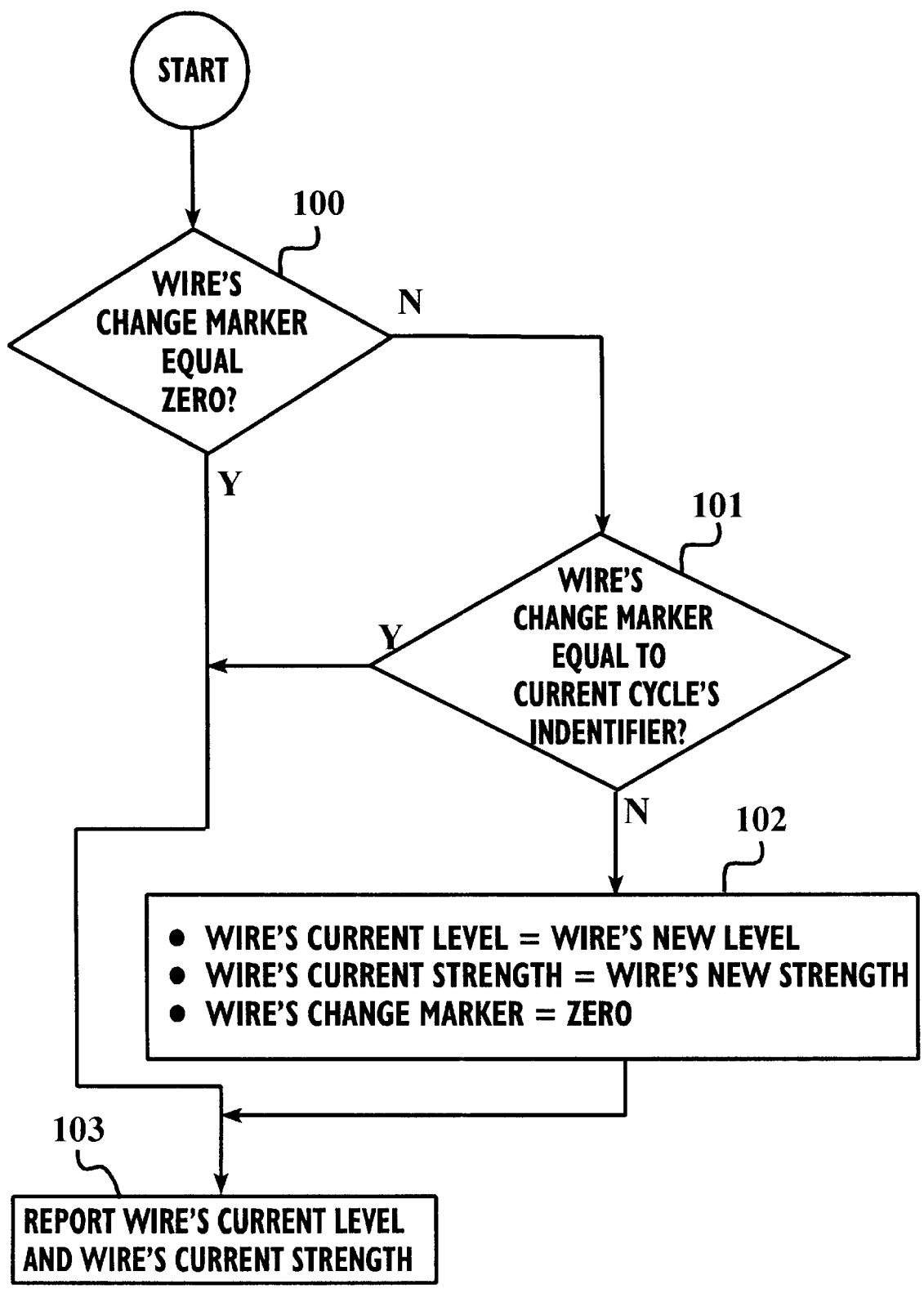
FIG. 4 illustrates a flow chart of the method used to get the current value of a Wire.

FIG. 4 is a flowchart of a method to get the current value of a wire. It is initiated by an Input Node at the encapsulating Module's request. The method begins by first asking(100) whether the Change Marker data is zero, or some other value that refers to the cycle in which a New Level or New Strength was asserted on the wire. If the change marker is zero, then the Wire's Current Level and Current Strength are up to date, and can be immediately reported(103). If the change marker is nonzero, that is, if it identifies a cycle, the next step (101) is to determine whether the Wire's value changed in an earlier cycle. If the Change Marker is nonzero and refers to the current cycle, then the value of Current Level and Current Strength still represent the current value of the wire. Otherwise, the New Level and New Strength need to be synchronized. This is done in step (102) by copying the New Level to Current Level, copying New Strength to Current Strength and setting the Change Marker to zero. Then the Wire's Current Level and Current Strength can be reported (103).

Figure 5:
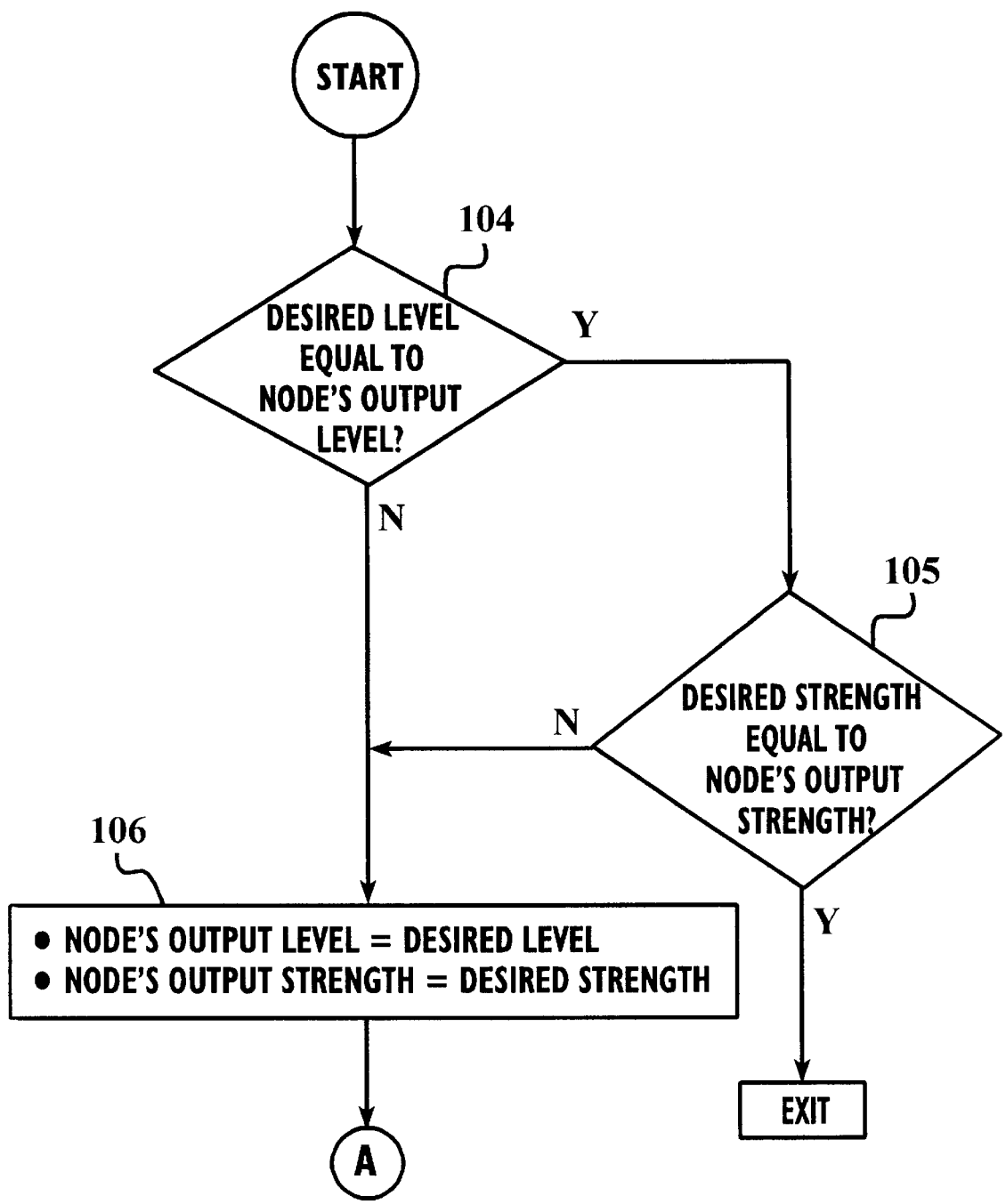
FIGS. 5, 6 and 7 collectively illustrate a flow chart of the method to access both a node's and wire's information storage means for the purpose of asserting a new data value onto the wire.
Figure 6:
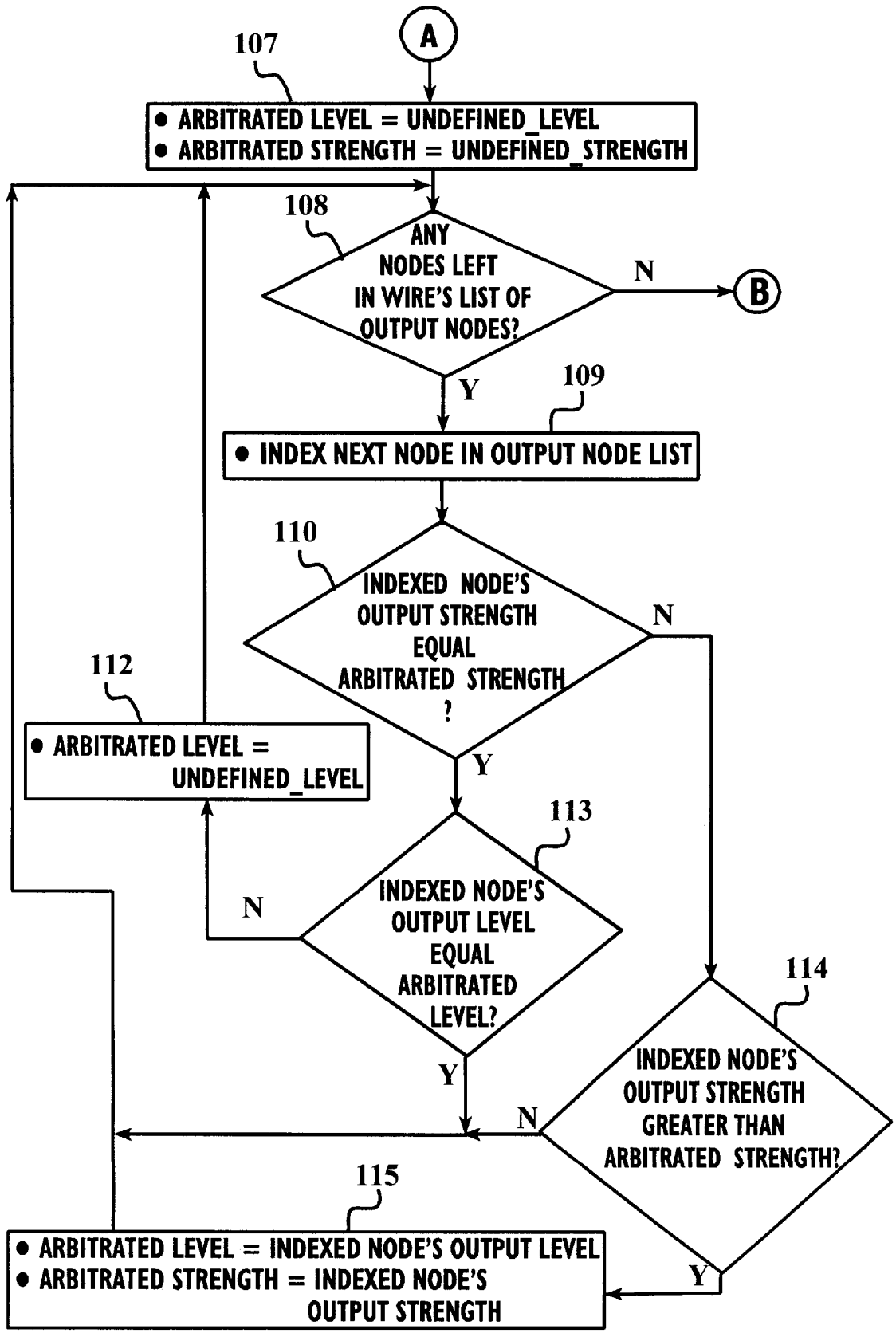
Figure 7:
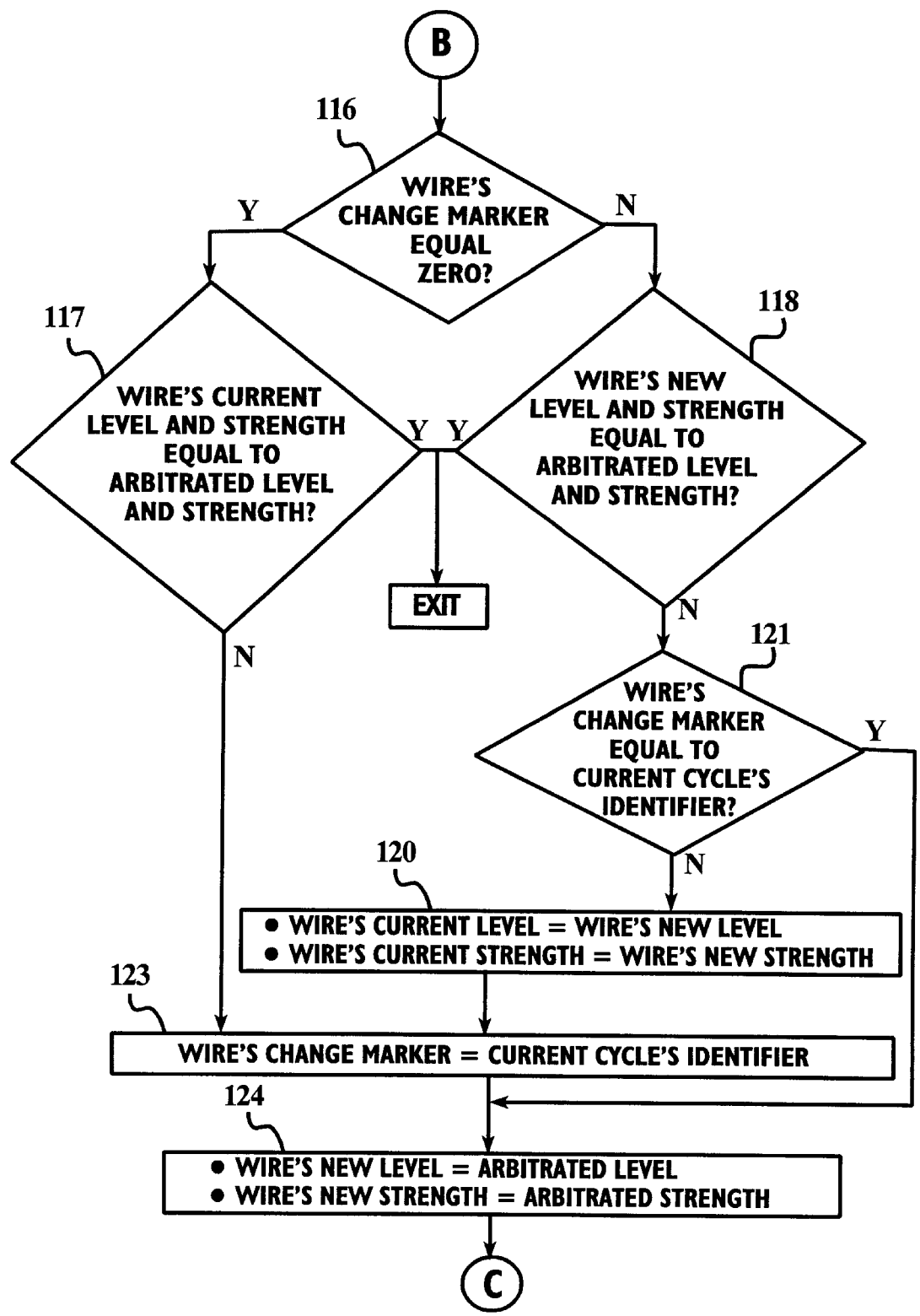

FIGS. 5–7 relate to an overall method of determining a Wire's New Level, New Strength, and Change Marker, as well as arbitrating among various Output Nodes connected to a Wire on the basis of their relative strengths and performing Asynchronous Transition Functions. FIG. 5 shows a method for deciding whether the data structure for a particular Output Node needs to be updated. This method is initiated when the Level or Strength of an Output Node needs to be modified. The decision as to whether modification is needed is made by the module encapsulating the Output Node. This is done without distinguishing whether the newly desired value will be a New Level or a New Strength. That is, as shown in FIG. 5, when an output node desires to assert a value for either Level or Strength, the first step(104) is to determine whether the Desired Level is the same as the value currently stored as the Node's Output Level. If so, the next step (105) is to determine whether the Desired Strength is the same as the value already stored in Node's Output Strength. If both values are unchanged, no further action is needed with respect to that particular node because the output data structure will not be changed: in that event, the method concludes. If either value is to be changed, then both the Node's Output Level and its Output Strength are updated to reflect the value of the Desired Level and Desired Strength, respectively (106). As a result, only those nodes which are asserting changed values will receive further processing. It should be noted here that a node will not be allowed to assert an "Undefined" level or strength at this point, as these values are reserved for identifying and resolving conflicts.

Once it is decided to change an Output Nodes's data structure, the next step is to have the affected Wire decide, or arbitrate, among all the Output Nodes attached to it. FIG. 6 is a flowchart of an arbitration method, that is a method which is used to decide which of several output nodes will be able to determine the New Level and New Strength of a wire. To begin the arbitration method of FIG. 6, the value for an Arbitrated Level is temporarily set to be "undefined" (107). This value is chosen so that it does not correspond to any defined Level value. Further, an Arbitrated Strength is temporarily set to be "undefined". This value is set to be less than any defined Strength value. In the next steps (108–115) the List of Output Nodes is consulted (there will be at least one Node) to identify any other nodes that must be processed. If any node remains to be reviewed(108), the node is indexed (109) and the indexed Node's Output Strength is compared to the Arbitrated Strength(110). If these values are equal, the Indexed Node output Level is compared to the Arbitrated Level (113). If the Indexed Node's Output Strength equals the Arbitrated Strength(110) and the Indexed Node's Output Level equals the Arbitrated Level(113), there is no conflict, and no need to decide between the two nodes and the next Node on the List of Output Nodes is consulted (108,109). If the Indexed Node's Output Strength equals the Arbitrated Strength(110) but the Indexed Node's Output Level does not equal the Arbitrated Level(113), there is a conflict, and the Arbitrated Level is set to be undefined (112), and the next Node on the List of output Nodes is consulted (108, 109). If the Indexed Node's Output Strength is not the same as the Arbitrated Strength(110), the relative values are compared (114). If the Indexed Node's Output Strength is less than or equal to the Arbitrated Strength(114), the Indexed Node values will be ignored, and the next Node on the List of Output Nodes is consulted (108, 109). If the Indexed Node's Output Strength is greater than the Arbitrated Strength in step (114), then the Arbitrated Strength and Arbitrated Level are updated (115) to reflect the respective values from the Indexed Node. Again, the Wire's List of Output Nodes is consulted (108,109) until there are no Nodes left on the list. Once all the nodes are processed, a final decision on the Arbitrated Level and Strength is made, as shown in detail in FIG. 7.

FIG. 7 relates to the process of updating the data structure of a Wire. The final two steps yield the Wire's Change Marker, New Level and New Strength. The Change Marker is used in steps 100 and 101, and the New Level and New Strength are used in step 102 of FIG. 4, where a wire is read, or synchronized. It is preferred in the present invention to read, or synchronize a Wire on demand. While a Wire may be synchronized once per cycle, the inventors find it convenient to allow the New Strength and New Level values of a Wire to change one or more times in a cycle, and be stored and then read, or synchronized, in a later cycle.

Turning to FIG. 7, the updating process begins with an inquiry as to whether the Wire's Change Marker is equal to zero (116). If so, the Wire is ready to be updated. The Wire's Current Level and Strength are compared to the Wire's previously determined Arbitrated Level and Arbitrated Strength(117). If these values are the same, there is nothing to update, and the method concludes. If not, the Wire's Change Marker is reset to the Current Cycle's Identifier (123), the Wire's New Level is updated to reflect the Arbitrated Level and the Wire's New Strength is updated to reflect the Arbitrated Strength (124). If the Change Marker is not equal to zero(116), the Wire's New Level and New Strength are compared to the Arbitrated Level and Arbitrated Strength (118). Again, if these values are the same, the inquiry is over because there is no need to update anything. If, however, the Change Marker is nonzero(116) and the New Level and New Strength are not equal to the Arbitrated Level and Arbitrated Strength(118), a further inquiry must be made as to whether the Wire's Level or Strength value changed in a previous cycle (121) or in the present cycle. If the Wire's Change Marker does not equal the Current Cycle's Identifier(121), then the change occurred in a previous cycle. The Wire needs to be updated according to the previous change by having the stored value of the Wire's Current Level updated to reflect the Wire's New Level, and the stored value of the Wire's Current Strength updated to reflect the Wire's New Strength (120). Then the Wire's Change Marker is set to the current cycle's identifier(123), the Wire's New Level is updated to reflect the Arbitrated level, and the New Strength is updated to reflect the Arbitrated Strength(124).

If the Wire's Change Marker equals the Current Cycle Identifier(121), then the value is being changed again in the current cycle. There is no need to update the Wire's Change Marker, as it is already set to the current cycle's identifier. The Wire's New Level is set to the value of the Arbitrated Level, and the Wire's New Strength is set to the value of the Arbitrated Strength(124).

The arbitration method of FIG. 6 is used when a wire is operating in the arbitrated mode. The method of FIG. 7 is depicted presuming a wire operating in the arbitrated mode. The restricted mode of operation for a wire is used when it is known that the List of Output Nodes contains exactly one entry. When this is the case, performance is optimized by performing the method of FIG. 5, skipping the method of FIG. 6, and performing a modified form of FIG. 7 where step 116 is preceded by an update of the Wire's Arbitrated Level and Arbitrated Strength with values of the single node's Output Level and Output Strength, respectively.

Figure 8A:
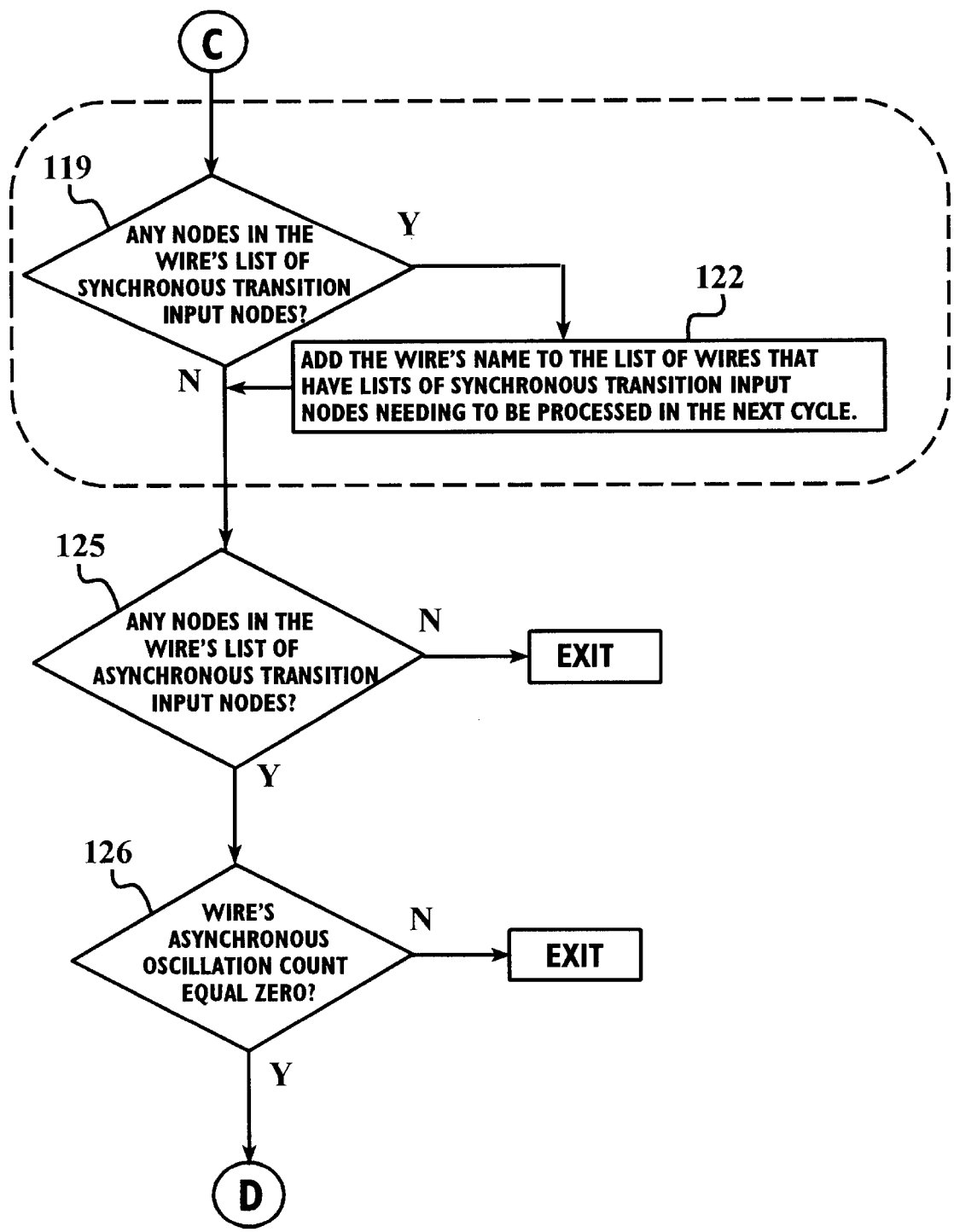
FIG. 8(A,B) is a flow chart for executing Transition Functions and limiting oscillation in a Wire.
Figure 8B:
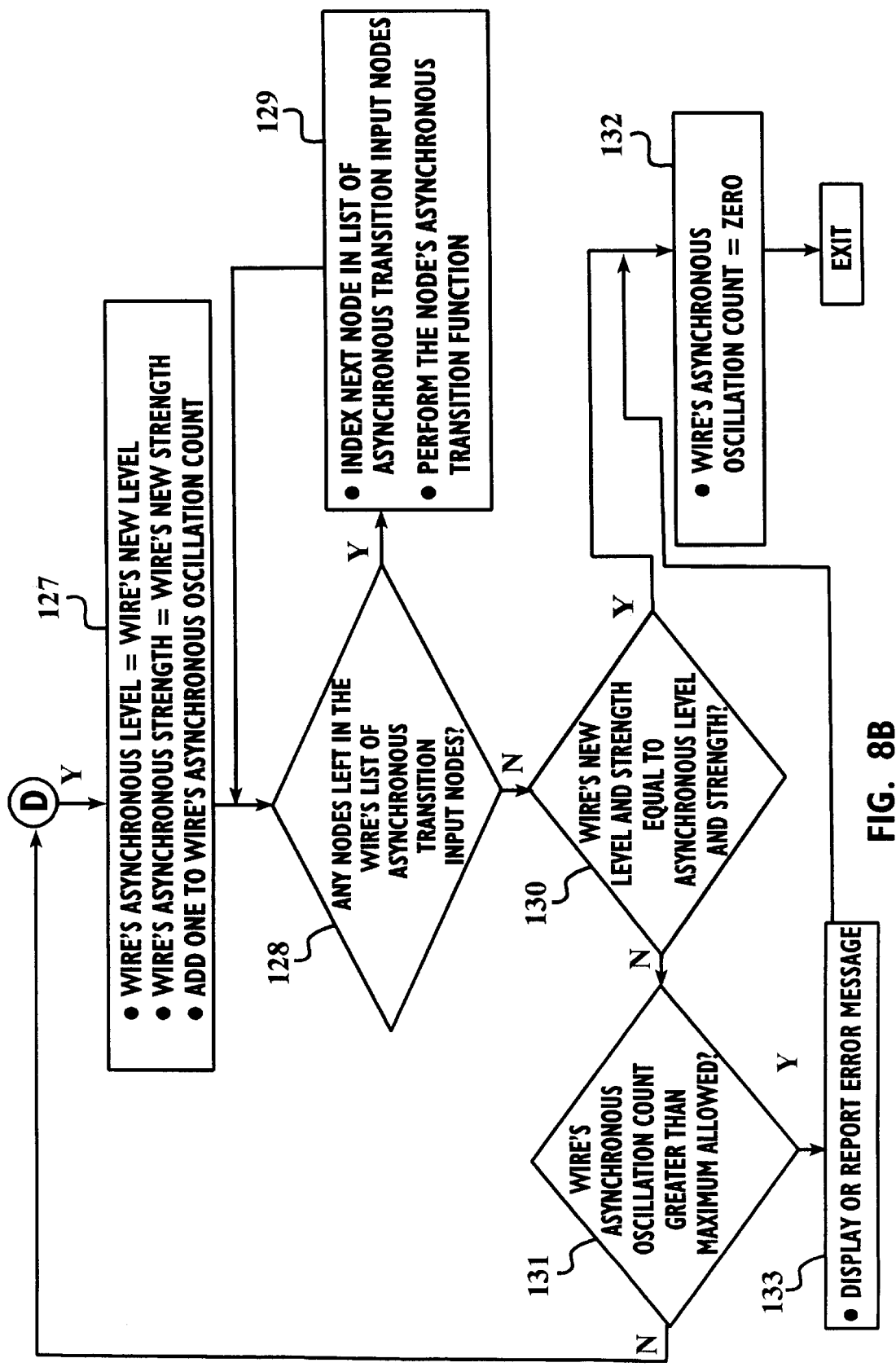

FIG. 8(A,B) relates to the method of processing various types of Transition Functions which may be included for simulation. This method is performed only if the Wire's New Level or New Strength have changed. Steps 119 and 122 relate to Synchronous Transition Functions that the simulation engine will execute at the beginning of the next cycle. These steps are included in FIG. 8(A,B) for clarity of explanation. In actual practice, it is preferred to insert these steps immediately before step 123 in FIG. 7 as there is a gain in efficiency. Those of ordinary skill in the art will recognize that other arrangements of steps are possible as well, with a potential gain in efficiency. However, the steps are grouped throughout this disclosure for the purpose of more clearly illustrating the method.

The method of processing the List of Synchronous Transition Functions for a given wire is accomplished by adding the Wire's Name to a list. This list is created in a given cycle (c) and processed in the immediately following cycle (c+1). In this manner, the list represents all wires whose value changed in cycle (c) and have a populated List of Synchronous Transition Input Nodes. The cycle based simulator preferably processes this list at the beginning of cycle (c+1) before proceeding with other simulation activities by performing the Synchronous Transition Function for each node in each wire's List of Synchronous Transition Input Nodes.

Thus, in FIG. 8(A,B), the Wire's List of Synchronous Transition Input Nodes is consulted to determine whether there are any Nodes residing on the List (119), and if there are, the Wire's Name is added to a List of Wires that have Lists of Synchronous Transition Input Nodes to be processed in the next cycle (122). Next, the Wire's List of Asynchronous Transition Input Nodes is consulted to determine whether there are any Nodes residing on that List (125). If there are no Nodes in the Wire's List of Asynchronous Transition Input Nodes(125), there are no further operations that the module needs to perform in response to a change in a Wire's New Strength or New Level, and the method concludes.

Where there are nodes in the Wire's List of Asynchronous Transition Input Nodes (125), an inquiry as to Oscillation Count is performed(126) in order to detect and prevent recursion, a condition where a method restarts itself over and over again. If a Wire's value is oscillating, the Oscillation Count will be non-zero. This condition only occurs if, while performing an Asynchronous Transition Function (129) the value of the Wire was changed. Thus the entire method starting at (104) was re-entered from within (129). By preventing recursion at (126) the method guarantees that all Input Nodes will be able to process a given Asynchronous Level and Asynchronous Strength before either value is allowed to change. Therefore, if the Oscillation count is not equal to zero, no further action will be taken, and the method concludes.

If the Wire's Oscillation Count equals zero(126), the Wire's Asynchronous Level is updated to reflect the value of the New Level, its Asynchronous Strength is updated to reflect the value of the New Strength, the Wire's Asynchronous Oscillation Count is increased by one unit (127). If any Node on the Wire's List of Asynchronous Transition Input Nodes remains to be processed(128), then that Node is indexed and instructed to perform the Node's Asynchronous Transition Function(129), in turn according to its position on the List of Asynchronous Transition Input Nodes (129). The Asynchronous Level and Asynchronous Strength are the only values to be consulted by the Asynchronous Transition Functions. The Asynchronous Level and Strength values are used because, in the presence of oscillation, some Asynchronous Transition Function will be causing the assertion of a "newer New Level and Strength". In order to prevent the serialization of what is supposed to be parallel behavior, each node having an Asynchronous Transition Function gets to react to the same "New Level and Strength" (via Asynchronous Level and Strength) before reacting to a subsequent "newer New Level and Strength". When no further Nodes are left, the Wire's New Level and Strength are compared to the Asynchronous Level and Strength(130) to determine whether oscillation is occurring. If the Wire's New Level and Strength are equal to the Asynchronous Level and Strength(130), oscillation is not occurring, and the Wire's Asynchronous Oscillation Count is set to zero(132) and the method concludes. If these values are different(130), and if the Wire's Asynchronous Oscillation Count is not greater than the maximum allowed(131), the Wire's Asynchronous Level and Strength are updated, the Wire's Asynchronous Oscillation Count increased by one increment (127), and the List of Asynchronous Input Nodes is processed again(128, 129). If the Wire's Asynchronous Oscillation Count is greater than the Maximum Allowed(131), an error message is logged(133) so that the simulator can respond to the error after exit. The selection of a Maximum Allowed number of oscillations will determine the simulator's tolerance of an Output Node or set of Output Nodes that change the value of a Wire from within Asynchronous Transition Functions. The method concludes by setting the Wire's Asynchronous Oscillation Count to zero(132).

A present embodiment of this invention is within a cycle-based simulator being developed for the purpose of testing embedded software on a microcontroller. Two configurations were tested for simulation performance. The first configuration had a CPU, memory address decoder, and memory. The second configuration had a CPU, memory address decoder, memory, a Computer Operating Properly (COP) watchdog module, a low side power driver, two (2) Serial Peripheral Interface (SPI) modules and a system integration module. Simulation performance was measured on a 75 MHz Sun SPARCstation-20. The first configuration simulated at a rate of 190,000 cycles per second, or for the CPU used, 89,000 instructions per second. The second configuration was simulated under conditions where the included SPI modules were actively communicating at a bit rate of 129,000 bits per second, generating simulated interrupts at a rate of 16, 000 interrupts per second and Direct Memory Access (DMA) at a rate of 16,000 bytes per second. This simulation performed at a rate of 52,000 cycles per second, or 12,900 CPU instructions per second.

The foregoing descriptions of specific embodiments of the present invention have been presented for purposes of illustration and description. They were chosen to best explain the principles of the invention and its practical application, to thereby enable others skilled in the art to best utilize the invention and some of its potential modifications. They are not intended to be exhaustive, and do not limit the invention, or the claims which follow. Those with ordinary skill in the art will recognize that many modifications and variations are possible in light of the above teaching.

We claim:

1. A method of simulating an electronic system having first and second interconnected modules, said method comprising the steps of:

simulating the first module as an output driver node, and the second module as an input receiver node, each such node having associated therewith a data structure selected from the group comprising Node Name, Wire Name, Output Level, Output Strength, Synchronous Transition Function and Asynchronous Transition Function;

simulating the connection between the first and second modules as a wire, wherein the nodes associated with each of the first and second modules allow transfer of information to and from the wire and wherein the simulation of each module is independent of the order of simulation among the modules;

and wherein the wire stores the information, allows for comparison between new and current information, instructs a module to perform an operation, and indicates a change in the stored information.

2. A method of simulating an electronic system having first and second interconnected modules, said method comprising the steps of: simulating the first module as an output driver node, and the second module as an input receiver node;

simulating a connection between the first and second modules as a wire, wherein the nodes associate with each of the first and second modules allow transfer of information to and from the wire and wherein the simulation of each module is independent of the order of simulation among the modules, and wherein each wire has associated therewith a data structure selected from the group comprising Wire Name, Current Level, Current Strength, New Level, New Strength, Arbitrated Level, Arbitrated Strength, Change Marker, List of Output Nodes, List of Input Nodes, List of Synchronous Transition Input Nodes, List of Asynchronous Transition Input Nodes, Asynchronous Level, Asynchronous Strength and Asynchronous Oscillation Count;

and wherein the wire stores the information, allows for comparison between new and current information, instructs the second module to perform an operation, and indicates a change in the stored information.

3. The method of claim 1, wherein the output driver node has associated therewith data which is assertable on a wire identified by the Wire Name and selected from the group comprising Wire Name, Node Name, Output Level and an Output Strength.

4. The method of claim 1, wherein the input receiver node has associated therewith data selected from the group comprising Wire Name, Node Name, Synchronous Transition Function and Asynchronous Transition Function.

5. The method of claim 4, wherein the Synchronous Transition Function identifies an operation which the second module will perform whenever a change in the current information stored by a wire identified by the Wire Name is indicated, and which is independent of operations performed by any other module.

6. The method of claim 4, wherein the Asynchronous Transition Function identifies an operation which the second module will perform whenever a change in the new information stored by a wire identified by the Wire Name is indicated, and which is independent of operations performed by any other module.

7. The method of claim 1, wherein the Node Name uniquely identifies the Node, and the Wire Name uniquely identifies the Wire.

8. The method of claim 1, further comprising the step of: accessing a Node's or a Wire's information storage means for the purpose of asserting a new data value onto the Wire.

9. The method of claim 8, further comprising the step of:

arbitrating among several Output Nodes to determine a new data value for the Wire.

10. The method of claim 9, further comprising the step of:

updating the Wire's data structure as a result of the arbitration step.

11. The method of claim 10, further comprising the step of:

performing a Transition Function.

12. The method of claim 11, further comprising the step of:

limiting oscillation in the Wire.

13. The method of any one of claims 8–12, further comprising the step of:

synchronizing the Wire.

14. A method of simulating an electronic system having first and second interconnected modules, said method comprising the steps of:

simulating the first module as an output driver node and the second module as an input receiver node; and simulating the connection between the first and second modules as a wire coupling the output driver node and the input receiver node, such that in each of a series of simulation cycles, the wire is able to acquire information from the output driver node and to transfer information to the input receiver node;

wherein the wire:

designates information acquired from the output driver node in any given cycle as new information for that cycle;

designates information acquired from the output driver node in a cycle prior to said given cycle as current information for the given cycle;

instructs the output driver node to initiate an asynchronous transition function in the second module when said new information changes value; and instructs the output driver node to initiate a synchronous transition function in the second module when said current information changes value.

* * * * *